United States Patent
Tong et al.

(10) Patent No.: US 8,502,521 B2
(45) Date of Patent: Aug. 6, 2013

(54) MEASURING DEVICE FOR HARD DISK DRIVE

(75) Inventors: Song-Lin Tong, Shenzhen (CN); Qi-Yan Luo, Shenzhen (CN); Peng Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 285 days.

(21) Appl. No.: 13/162,584

(22) Filed: Jun. 17, 2011

(65) Prior Publication Data

US 2012/0169321 A1     Jul. 5, 2012

(30) Foreign Application Priority Data

Dec. 29, 2010    (CN) .......................... 2010 1 0611259

(51) Int. Cl.
     *G01R 31/02*      (2006.01)
     *G01R 21/00*      (2006.01)

(52) U.S. Cl.
     USPC .............................................. 324/72; 702/64

(58) Field of Classification Search
None
See application file for complete search history.

(56) References Cited

U.S. PATENT DOCUMENTS

| | | | | |
|---|---|---|---|---|
| 7,167,334 B2* | 1/2007 | Rote et al. | ........................ | 360/75 |
| 7,378,833 B2* | 5/2008 | Wagner | ....................... | 324/76.54 |

* cited by examiner

*Primary Examiner* — Jermele M Hollington
*Assistant Examiner* — Trung Nguyen
(74) *Attorney, Agent, or Firm* — Altis Law Group, Inc.

(57) ABSTRACT

A measuring device for a hard disk drive includes a first input node, a hard disk drive having a first input terminal, the first input terminal being coupled to the first input node to provide power to the hard disk drive. A first input current sampling unit is coupled between the first input node and the first input terminal of the hard disk drive to obtain a first input current $I_{in1}$. A first input voltage sampling unit is coupled to the first input terminal of the hard disk drive to obtain a first input voltage $U_{in1}$. A control unit is coupled to the first input current sampling unit and the first input voltage sampling unit to receive the first input current and the first input voltage.

10 Claims, 2 Drawing Sheets

MEASURING DEVICE FOR HARD DISK DRIVE

BACKGROUND

1. Technical Field

The present disclosure relates to a measuring device for a hard disk drive.

2. Description of Related Art

When designing a power source for a hard disk drive, electrical parameters of the hard disk drive should be considered. Therefore, how to measure the electrical parameters of the hard disk drive precisely and quickly becomes an important consideration in the manufacturing stage.

Therefore there is room for improvement in the art.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
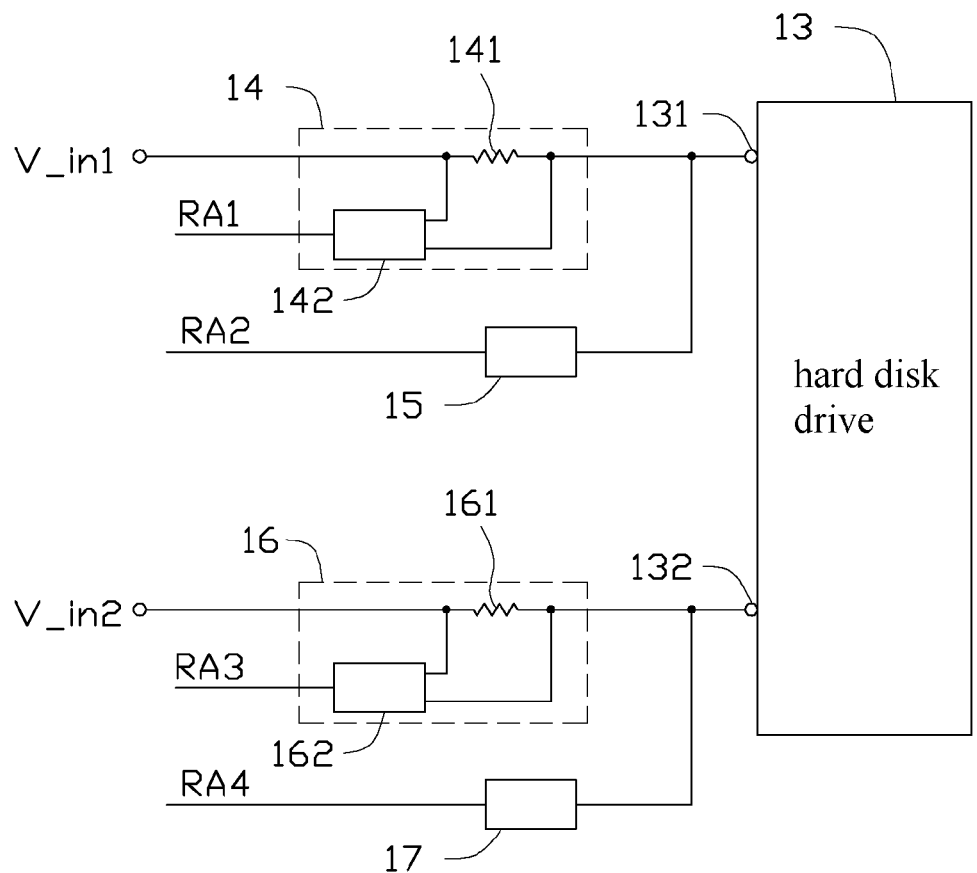
FIG. 1 is a schematic, block diagram of a measuring device for a hard disk drive in accordance with an embodiment of the present disclosure.
Figure 2:
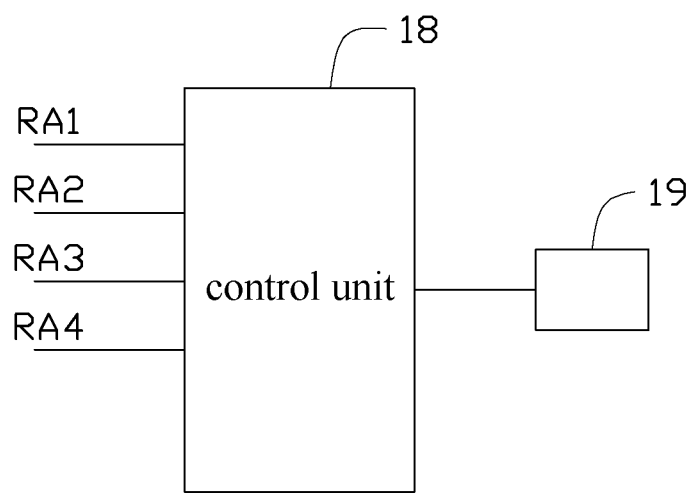
FIG. 2 is a schematic, block diagram of a control unit connected to elements in FIG. 1.

As shown in FIG. 1 and FIG. 2, a measuring device for a hard disk drive 13 in accordance with an embodiment of the present disclosure includes a first input node V_in1, a second input node V_in2, a first input current sampling unit 14, a first input voltage sampling unit 15, a second input current sampling unit 16, a second input voltage sampling unit 17, a control unit 18, and a display unit 19.

The hard disk drive 13 has a first input terminal 131 and a second input terminal 132. The first input node V_in1 is coupled to the first input terminal 131 of the hard disk drive 13 to provide a first power to the hard disk drive 13. The second input node V_in2 is coupled to the second input terminal 132 of the hard disk drive 13 to provide a second power to the hard disk drive 13. In this embodiment, the first input node V_in1 provides a voltage of about 12V to the hard disk drive 13 and the second input node V_in2 provides a voltage of about 5V to the hard disk drive 13.

The first input current sampling unit 14 is configured to obtain a first input current Iin1 and transmit the first input current Iin1 to the control unit 18 through an input port RA1 of the control unit 18. In this embodiment, the first input current sampling unit 14 includes a first sampling resistor 141 and a first voltage acquired unit 142. The first sampling resistor 141 of the first input current sampling unit 14 is coupled between the first input node V_in1 and the first input terminal 131 of the hard disk drive 13. The first voltage acquired unit 142 is coupled to the first sampling resistor 141 to measure a voltage U1 thereof. The first voltage acquired unit 142 is coupled to the input port RA1 of the control unit 18 to transmit the voltage U1 to the control unit 18. And then, the control unit 18 can calculate the input current according to the voltage U1. The first sampling resistor 141 can be a manganese wire resistor.

The first input voltage sampling unit 15 is coupled to the first input terminal 131 of the hard disk drive 13 to obtain a first input voltage Uin1. The first input voltage sampling unit 15 transmits the first input voltage Uin1 to the control unit 18 through an input port RA2 of the control unit 18.

A first resistance value R1 of the first sampling resistor 141 is previously stored in the control unit 18. The first input current Iin1 can be calculated as Iin1=U1/R1 by the control unit 18. A first input power Pin1 of the hard disk drive 13 can be calculated as Pin1=Uin1*Iin1. In addition, when the hard disk drive 13 is in reading or writing mode, the input current of the hard disk drive 13 may be increased. Therefore, the control unit 18 can further obtain a first maximum current Imax1 of the first input current Iin1, a first maximum voltage Umax1 corresponding to the first maximum current Imax1 and a first maintaining time t1 of the first maximum current Imax1. Therefore, a first maximum power Pmax1 of the first input power can be calculated as Pmax1=Umax1*Imax1.

The second input current sampling unit includes a second sampling resistor 161 and a second voltage acquired unit 162. The second sampling resistor 161 is coupled between the second input node V_in2 and the second input terminal 132 of the hard disk drive 13. The second voltage acquired unit 162 is coupled to the second sampling resistor 161 to obtain a voltage U2 of the second sampling resistor 161. The second voltage acquired unit 162 is coupled to an input port RA3 of the control unit 18 to transmit the voltage U2 to the control unit 18. The second sampling resistor 161 can also be a manganese wire resistor.

The second input voltage sampling unit 17 is coupled to the second input terminal 132 of the hard disk drive 13 to obtain a second input voltage Uin2. The second input voltage sampling unit 17 transmits the second input voltage Uin2 to the control unit 18 through an input port RA4 of the control unit 18.

A second resistance value R2 of the second sampling resistor 161 is previously stored in the control unit 18. The second input current Iin2 can be calculated as Iin2=U2/R2 by the control unit 18. A second input power Pin2 of the hard disk drive 13 can be calculated as Pin2=Uin2*Iin2. In addition, the control unit 18 further obtains a second maximum current Imax2 of the second input current Iin2, a second maximum voltage Umax2 corresponding to the Imax2 and a second maintaining time t2 of the Imax2. Therefore, a second maximum power Pmax2 of the second input power can be calculated as Pmax2=Umax2*Imax2.

The display unit 19 is coupled to the control unit 18 to display the first input current Iin1, the second input current Iin2, the first input voltage Uin1, the second input voltage Uin2, the first input power Pin1 and the second input power Pin2.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A measuring device for a hard disk drive, comprising:
    a first input node for being coupled to a first input terminal of the hard disk drive to provide power to the hard disk drive;
    a first input current sampling unit for being coupled between the first input node and the first input terminal of the hard disk drive to obtain a first input current Iin1;

a first input voltage sampling unit coupled to the first input terminal of the hard disk drive to obtain a first input voltage Uin1; and a control unit being coupled to the first input current sampling unit and the first input voltage sampling unit to receive the first input current Iin1 and the first input voltage Uin1.

2. The measuring device of claim 1, wherein a first input power Pin1 of the hard disk drive is calculated as Pin1=Uin1*Iin1 by the control unit.

3. The measuring device of claim 1, wherein the control unit further obtain a first maximum current Imax1 of the first input current, a first maximum voltage Umax1 corresponding to the first maximum current Imax1 and a first maintaining time of the first maximum current Imax1.

4. The measuring device of claim 1, wherein the first input current sampling unit comprises a first sampling resistor and a first voltage acquired unit, the first sampling resistor is coupled between the first input node and the first input terminal of the hard disk drive, the first voltage acquired unit is coupled to the first sampling resistor to obtain a voltage U1 of the first sampling resistor and transmits the voltage U1 to the control unit.

5. The measuring device of claim 1, wherein a first resistance R1 of the first sampling resistor is previously stored in the control unit, the first input current Iin1 is calculated as Iin1=U1/R1.

6. The measuring device of claim 1, further comprising:
a second input node for being coupled to a second input terminal of the hard disk drive;

a second input current sampling unit for being coupled between the second input node and the second input terminal of the hard disk drive to obtain a second input current Iin2, the second input current sampling unit being coupled to the control unit to transmit the second input current Iin2 to the control unit; and a second input voltage sampling unit coupled to the second input terminal of the hard disk drive to obtain a second input voltage Uin2, the second input voltage sampling unit being coupled to the control unit to transmit the second input voltage Uin2 to the control unit.

7. The measuring device of claim 6, wherein a second input power Pin2 of the hard disk drive is calculated as Pin2=Uin2*Iin2 by the control unit.

8. The measuring device for a hard disk drive of claim 7, wherein the control unit obtain a second maximum current Imax2 from the second input current, a second maximum voltage Umax2 corresponding to the Imax2 and a maintaining time t2 of the Imax2.

9. The measuring device of claim 6, wherein the second input current sampling unit comprises a second sampling resistor and a second voltage acquired unit, the second sampling resistor is coupled between the second input node and the second input terminal of the hard disk drive, the second voltage acquired unit is coupled to the second sampling resistor to obtain a voltage U2 of the second sampling resistor and transmits the voltage U2 to the control unit.

10. The measuring device of claim 1, further comprising a display unit being coupled to the control unit to display the first input current Iin1 and the first input voltage Uin1.

* * * * *